(12) United States Patent
Pigur et al.

(10) Patent No.: US 7,776,166 B2
(45) Date of Patent: Aug. 17, 2010

(54) TEXTURE AND GRAIN SIZE CONTROLLED HOLLOW CATHODE MAGNETRON TARGETS AND METHOD OF MANUFACTURE

(75) Inventors: Bjoern Pigur, Brooklyn, NY (US); Alfred Snowman, Englewood, NJ (US)

(73) Assignee: Praxair Technology, Inc., Danbury, CT (US)

( * ) Notice: Subject to any disclaimer, the term of this patent is extended or adjusted under 35 U.S.C. 154(b) by 819 days.

(21) Appl. No.: 11/634,742

(22) Filed: Dec. 5, 2006

(65) Prior Publication Data

US 2008/0257724 A1 Oct. 23, 2008

(51) Int. Cl.
C22F 1/08 (2006.01)
(52) U.S. Cl. ............... 148/681; 148/682; 204/298.12; 204/298.13; 72/365.2
(58) Field of Classification Search ................ 148/681
See application file for complete search history.

(56) References Cited

U.S. PATENT DOCUMENTS

| 6,283,357 | B1 * | 9/2001 | Kulkarni et al. ............. 228/155 |
| 6,887,356 | B2 | 5/2005 | Ford et al. ............. 204/298.12 |
| 7,041,204 | B1 | 5/2006 | Cooper .................. 204/298.12 |
| 7,275,407 | B2 * | 10/2007 | Ginsberg et al. ............. 72/318 |
| 2001/0023726 | A1 * | 9/2001 | Koenigsmann et al. ...... 148/681 |
| 2002/0112789 | A1 * | 8/2002 | Jepson et al. ............... 148/422 |
| 2003/0019746 | A1 * | 1/2003 | Ford et al. ............ 204/298.13 |
| 2004/0073401 | A1 * | 4/2004 | Batzinger et al. ........... 702/181 |
| 2004/0141870 | A1 * | 7/2004 | Michaluk et al. ............. 419/13 |
| 2005/0034503 | A1 * | 2/2005 | Spreckelsen et al. .......... 72/377 |
| 2006/0042728 | A1 * | 3/2006 | Lemon et al. ............... 148/668 |
| 2007/0089815 | A1 * | 4/2007 | Wickersham et al. ....... 148/668 |
| 2007/0209741 | A1 * | 9/2007 | Carpenter et al. ........... 148/668 |
| 2007/0251819 | A1 * | 11/2007 | Kardokus et al. ...... 204/298.13 |

FOREIGN PATENT DOCUMENTS

JP 59073138 A * 4/1984

OTHER PUBLICATIONS

Clark et al., "Influence of Initial Ingot Breakdown on the Microstructural and Textural Evelopment of High-Purity Tantalum", Metallurgical Transactions A:Physical Metallurgy and Materials Sxience, vol. 22A (12), Dec. 1991, pp. 2959-2968.*
Hojas, "Radial Forging," Metals Handbook, 9.sup.th Edition, vol. 14, p. 145-149. (1988).*

* cited by examiner

Primary Examiner—Roy King
Assistant Examiner—Christopher Kessler
(74) Attorney, Agent, or Firm—Iurie A. Schwartz

(57) ABSTRACT

The present invention relates to methods for improving deposited film uniformity and controlling the erosion of sputter targets. Improved methods for achieving predetermined microstructure orientation in copper hollow cathode magnetron (HCM) sputter targets and targets prepared by such methods are disclosed.

13 Claims, 2 Drawing Sheets

Grain size analysis of erosion area
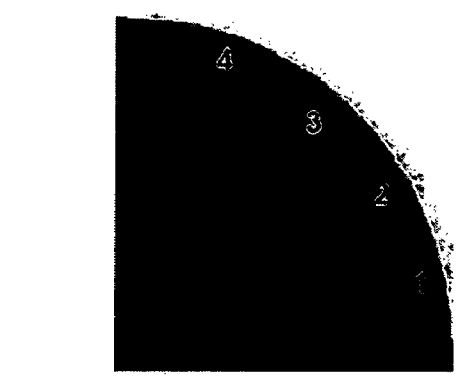
Figure 2b
Figure 2a
Figure 3a
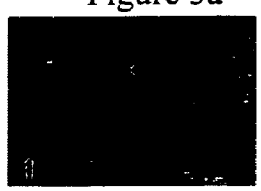
Figure 3b
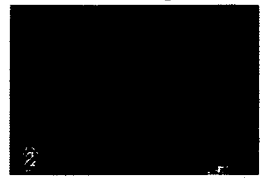
Figure 3c
Figure 3d
| Area | X-section grain size in micron | Sputter surface grain size in micron |
|------|-------------------------------|--------------------------------------|
| 1    | 32                            | 35                                   |
| 2    | 44                            | 44                                   |
| 3    | 36                            | 43                                   |
| 4    | 43                            | 50                                   |
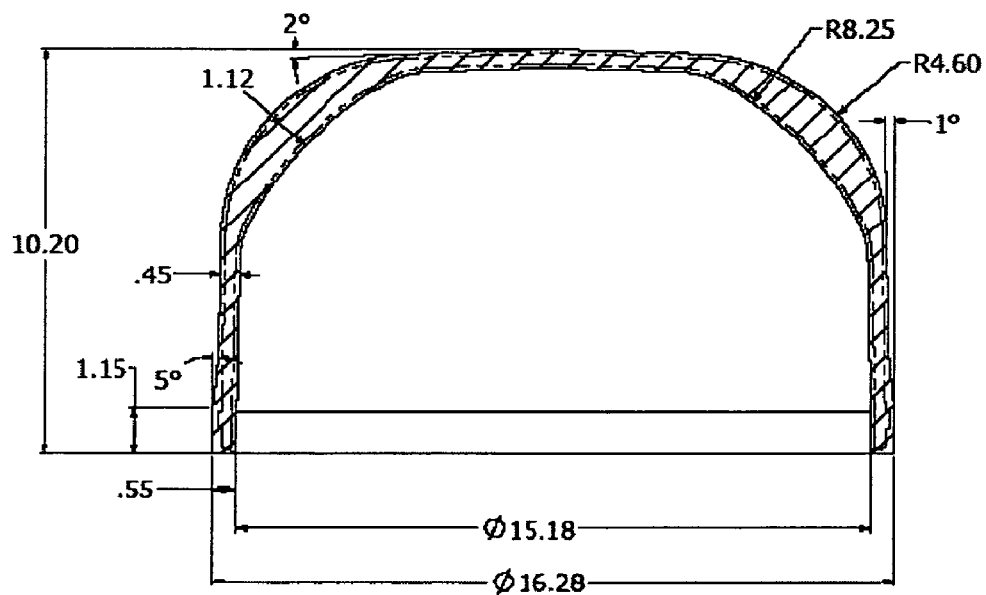
Figure 4

TEXTURE AND GRAIN SIZE CONTROLLED HOLLOW CATHODE MAGNETRON TARGETS AND METHOD OF MANUFACTURE

FIELD OF THE INVENTION

The present invention relates generally to the field of deposited thin films using sputtered film technology and sputtering targets. More particularly, the present invention relates to the use of hollow cathode magnetron (HCM) technology to improve film uniformity.

BACKGROUND OF THE INVENTION

Various sputter techniques have been used to deposit thin films over substrates. Deposited metal films on thin film semiconductor devices can be formed by a magnetron sputtering apparatus or other known sputtering techniques. As is well-known to those in the field, the magnetron sputtering apparatus delivers plasma ions of a gas to a target at a velocity sufficient to cause target surface particles to leave the surface and be predictably deposited as a thin layer or film on the surface of a substrate. The sputtering source can be a planar target, and ejected atoms travel predictably along a line-of-sight trajectory to deposit, for example, as a top layer on a semiconductor wafer whose deposition surface is oriented parallel to the erosion face of the target.

Hollow cathode magnetron (HCM) sputtering targets are produced in the shape of an inverted crucible or bell and are used as target materials. An inner chamber or cavity defined by the HCM target contains a plasma that erodes the interior wall surfaces of the target during use. HCM sputtering targets are useful and desired for their ability to deposit a film able to fill deep and narrow channels in a substrate. This is accomplished as target atoms, ejected from the interior walls of the target become ionized as they pass through the plasma. Magnetic fields then traject the ions in a direction perpendicular to the substrate. One disadvantage of the known HCM sputtering techniques is that the desirable film deposition uniformity they provide to a surface is brought about at the expense of significant non-uniform target erosion. Uneven target erosion eventually leads to uneven or non-uniform layer deposition on a substrate material. This, in turn leads to a potentially low number of acceptable products, such as wafers, being produced from each HCM target. Therefore, in designing a useful HCM sputtering target, two critical goals are a uniform erosion of the target and a uniform deposition of target material on a substrate.

Many attempts to improve target erosion uniformity have been made and are discussed and otherwise referred to in U.S. Pat. No. 6,887,356. However, many known HCM systems are either too mechanically complex, or do not adequately solve the problems of non-uniform target erosion leading to non-uniform film deposition on a substrate.

In semiconductor manufacturing Rs non-uniformity of sputtered films (deposited film thickness) is an important quality measure. Current technology approaches attempt to minimize Rs non-uniformity by controlling the texture and grain size of sputter targets. Therefore it is desirable to further improve deposited film Rs non-uniformity through the development of improved targets by optimizing the texture and grain size of 300 mm Cu HCM sputter targets.

U.S. Pat. No. 7,041,204 discloses that grain size is known to influence deposited film uniformity and is preferably less than about 100 microns. This patent further discloses a desire to increase magnetic flux pass through of a target by achieving a high degree of grain orientation (texture) in the (200) orientation via a common cold working process in a unidirectional method to achieve the desired texture and retains the resulting cold working stresses to achieve the desired increase in magnetic flux pass through.

U.S. Pat. No. 6,887,356 discloses a tantalum HCM target with substantially uniform grain size and texture. Grain size ranges from 5 ASTM+−2 (125 to 32 microns). This patent discloses employing a cold rolling process similar to the '204 patent, and maintains cold working induced stresses in the final target. In addition, the '356 patent cites dispersed textures of (111)-(100).

However, none of the known methods presented above have solved the critical issues leading to the non-uniform erosion of HCM targets. An improved method of manufacturing acceptable HCM targets would be highly advantageous to the industry.

SUMMARY OF THE INVENTION

According to one embodiment, the present invention is a Cu HCM sputter target having a predetermined, defined range of texture and microstructure.

The present invention is further directed to a method for manufacturing an optimized Cu HCM sputter target having a predetermined, defined range of texture and microstructure. More specifically, a copper billet is provided and hot forged by heating the billet for about 75 minutes at a temperature of from about 1650° F. to about 1750° F., followed by upset forging the billet to a predetermined first dimension to achieve a part, or HCM precursor. The part is rotated a first, second and third time and rotary forged in successive 90° increments and successive predetermined dimensions. The part is then quenched, followed by heating the quenched part for about 75 minutes at about 1112° F.+/−50° F. The part is then upset forged to a predetermined dimension, followed by air cooling the part. The part is then cold rolled to achieve a predetermined dimension by, preferably, incurring 0.040 in reductions per rolling pass. The part is then annealed at about 350° C. for about 2 hours, and finally spin formed to final hollow cathode magnetron predetermined dimensions.

According to further embodiments of the present invention the spin forming comprises methods selected from the group consisting of forging, hydro-forming and deep drawing.

BRIEF DESCRIPTION OF THE DRAWINGS

Other objects, features, embodiments and advantages will occur to those skilled in the art from the following description of preferred embodiments and the accompanying drawings, in which:

FIG. 2 is an enlarged cross-sectional side view of a section of a Cu HCM showing four regions of an erosion area;

FIGS. 3 a-d are photomicrographs of four regions of the section shown in FIG. 2 showing grain size; and FIG. 4 is a schematic cross-sectional side view of a Cu HCM.

DETAILED DESCRIPTION OF THE INVENTION

Figure 1:
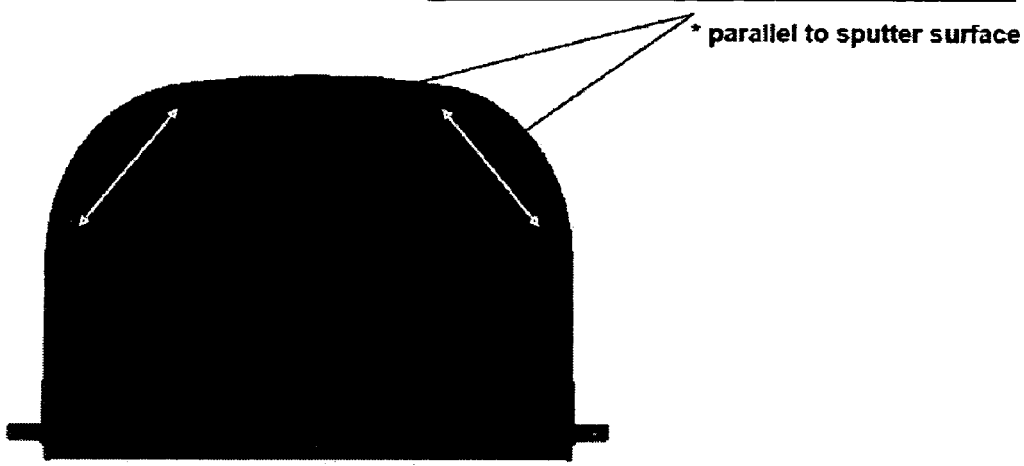
FIG. 1 is a cross-sectional side view of a Cu HCM showing texture analysis of erosion area.

According to one embodiment, the present invention achieves the desired, predetermined grain size of about 39 and a degree of texture (220) through the preferred manufacture method of hot forging, cold rolling, and annealing.

As shown in FIG. 1, sputter target texture for optimum Rs non-uniformity performance of 300 mm Cu HCM targets has been identified as having a texture analysis of erosion area set forth in Table 1 and FIG. 1. Such values are required if the HCM sputter target will have a useful and predictable life resulting in the manufacture of a predictable and defined number of deposited products, such as, for example, wafers and other semi-conductor components.

TABLE 1

| <111> | <200> | <220> | <311> |
|---|---|---|---|
| 12% (+/− 2%) | 14% (+/− 5%) | 46% (+/− 5%) | 28% (+/− 3%) |

Sputter target grain size for desired, optimum Rs non-uniformity performance of 300 mm Cu HCM targets has been identified as having preferred features and characteristics as shown in Table 2 and FIGS. 2 and 3a-3d.

TABLE 2

| Area | X-Section Grain Size (μm) | Sputter Surface Grain Size (μm) |
|---|---|---|
| 1 | 32 | 35 |
| 2 | 44 | 44 |
| 3 | 36 | 43 |
| 4 | 43 | 50 |

According to one preferred embodiment of the present invention, improved manufacturing of 300 mm Cu HCM sputter targets to predetermined texture and grain size values, results in improved Rs non-uniformity of sputtered films on silicon wafers. In comparing the results of the present invention versus prior art for this type of target, Rs non-uniformity measurement improved from 6% to 3%, a 50% improvement. Such improvement adds significant value to wafer manufacturers, as it increases wafer capability and widens the manufacturer's processing window for improvements in IC yield and quality. This improvement therefore exhibits a direct impact on operational costs of wafer fabs and IC design, and allows for more advanced products due to higher integration capability.

EXAMPLE

Cu HCM sputter targets of the present invention were made according to the following hot forge/cold roll/anneal process, which illustrates one preferred embodiment of the present invention. A Cu billet was processed under the following conditions to achieve the microstructure orientation set forth in Table 1 above. The billet was preheated for about 75 minutes at a temperature range of from about 1650° F. to about 1750° F. The billet was then upset forged into a part having a dimension of about 12.60 inches diameter×about 15.00 inches thickness. The part was rotated 90° and rotary forged to a dimension of about 9.84 inches diameter×about 24.80 inches thickness. The part was then again rotated 90° and upset forged to a dimension of about 12.60 inches diameter× about 15.00 inches thickness. The part was again rotated 90° and rotary forged to a dimension of about 9.84 inches diameter×about 24.80 inches thickness. At this point in the process, the part was water quenched, followed by preheating the part for about 75 minutes at 1112° F.±50° F. The part was then upset forge to a dimension of about 3.00 inches±0.125 inches thickness×16.5 inches diameter. The part was then air cooled, followed by cold rolling the part to reduce the thickness from about 3 inches to about 1.25 inches. Each rolling pass reduced the thickness by about 0.040 inches. The part was then annealed at about 350° C. for about 2 hours. The part was then spin formed into a hollow cathode magnetron at about 250° C. to about 300° C. to dimensions as indicated in FIG. 3. Desirably the HCM was then weld-flanged and machined to final dimensions as desired.

The spin forming may be substituted by forging, hydro-forming or deep drawing so long as the final microstructure orientation is retained to the specifications as presented herein at Table 1. Plate fabrication processing may vary with plate dimensions having a thickness of from about 0.9 to about 2 inches. One embodiment of the present invention contemplates the forging condition range effecting about a 40% to about an 80% reduction at a temperature of 500° C.-700° C. Further, the present invention contemplated cold rolling effecting about a 40% to about an 80% reduction.

While the invention has been described in detail with reference to specific embodiments thereof, it will be apparent to one skilled in the field that various changes, modifications and substitutions can be made, and equivalents employed without departing from, and are intended to be included within, the scope of the claims.

What is claimed is:

1. A method for forming a hollow cathode magnetron sputter target comprising the steps of:
   providing a copper billet;
   hot forging the billet by heating the billet for about 75 minutes at a temperature of from about 1650° F. to about 1750° F.;
   upset forging the billet to a predetermined first dimension to achieve a part;
   rotating the part by first, second and third successive 90° increments and alternating rotary forging and upset forging to a successive predetermined dimension;
   quenching the part;
   heating the part for about 75 minutes at about 1112° F.+/− 50° F.;
   upset forging the part to a predetermined dimension;
   air cooling the part;
   cold rolling the part to achieve a predetermined dimension by incurring 0.040 in reductions per rolling pass;
   annealing the part at about 350° C. for about 2 hours; and
   final forming the part to predetermined hollow cathode magnetron dimensions.

2. The method of claim 1, wherein the final forming comprises methods selected from the group consisting of spin-forming, forging, hydro-forming and deep drawing.

3. The method of claim 1, wherein forging effects a dimension reduction on the forged part, said dimension reduction occurring in the range of from about 40% to about 80% at a processing temperature of from about 500° C. to about 700° C.

4. The method of claim 1, wherein cold rolling effects a dimension reduction on the cold rolled part, said dimension reduction occurring in the range of from about 40% to about 80%.

5. The method of claim 1, wherein the hot forging renders the billet to overall dimensions of about 12.60 in diameter× about 15.00 thickness.

6. The method of claim 1, wherein the first rotary forging renders the forged part to overall dimensions of about 9.84 inches diameter×about 24.80 inches thickness.

7. The method of claim 1, wherein the second rotary forging renders the forged part to overall dimensions of about 12.60 inches diameter×about 15.00 inches thickness.

8. The method of claim 1, wherein the third rotary forging renders the forged part to overall dimensions of about 9.84 inches diameter×about 24.80 inches thickness.

9. The method of claim 1, wherein the part after water quenching is upset forged to overall dimensions of about 16.5 inches diameter×about 3.00 inches+/−about 0.125 inches thickness.

10. The method of claim 1, wherein the part after cold rolling is reduced in thickness from about 3 inches to about 1.25 inches.

11. The method of claim 1, wherein the part after cold rolling is reduced in thickness by about 0.040 inches per rolling pass.

12. The method of claim 1, wherein the hollow cathode magnetron displays grain orientation of 12%+/−2% at orientation <111>; 14%+/−5% at orientation <200>; 46%+/−5% at orientation <220>; and 28%+/−3% at orientation <311>.

13. The method of claim 1, wherein the Rs uniformity is about 3%.

* * * * *